United States Patent
Cheng et al.

(10) Patent No.: US 7,608,976 B1
(45) Date of Patent: Oct. 27, 2009

(54) ELECTROACTIVE CO-POLYMER SYSTEMS AND DEVICES USING THE SAME

(75) Inventors: Zhongyang Cheng, Auburn, AL (US); Zhimin Li, Medford, MA (US); Yuhong Wang, Auburn, AL (US)

(73) Assignee: Auburn University, Auburn, AL (US)

( * ) Notice: Subject to any disclaimer, the term of this patent is extended or adjusted under 35 U.S.C. 154(b) by 0 days.

(21) Appl. No.: 12/069,312

(22) Filed: Feb. 7, 2008

Related U.S. Application Data

(60) Provisional application No. 60/900,068, filed on Feb. 7, 2007.

(51) Int. Cl.
*H01L 41/08* (2006.01)
*H01M 4/62* (2006.01)

(52) U.S. Cl. .............. 310/311; 310/357; 310/800; 429/232

(58) Field of Classification Search ............... 310/311, 310/800
See application file for complete search history.

(56) References Cited

U.S. PATENT DOCUMENTS

| | | | | |
|---|---|---|---|---|
| 7,229,471 | B2 * | 6/2007 | Gale et al. | 623/1.15 |
| 7,362,035 | B2 * | 4/2008 | Jang et al. | 310/320 |
| 2007/0063793 | A1 * | 3/2007 | Jang et al. | 333/187 |
| 2008/0033526 | A1 * | 2/2008 | Atladottir et al. | 623/1.11 |
| 2008/0104813 | A1 * | 5/2008 | Jang et al. | 29/25.35 |
| 2008/0292968 | A1 * | 11/2008 | Lee et al. | 429/247 |
| 2008/0311479 | A1 * | 12/2008 | Lee et al. | 429/232 |

OTHER PUBLICATIONS

Zhongyang Cheng and Qiming Zhang, Field-Activated Electroactive Polymers, Mar. 2008, pp. 183-187, vol. 33, www.mrs.org/bulletin.

Yoseph Bar-Cohen and Qiming Zhang, Electroactive Polymer Actuators and Sensors, Mar. 2008, pp. 173-181, vol. 33, www.mrs.org/bulletin.

Zhimin Li, Yuhong Wang, and Z. Y Cheng, Electromechanical properties of poly vinylidene-flouride-chlorotrifluoroethylene . . . copolymer, Feb. 7, 2006, pp. 062904-1-062904-3, American Institute of Physics.

Yuri M. Shkel et al., "Electrostriction of polarizable materials: Comparison of models with experimental data", Jan. 1, 1998, pp. 415-424, J. Appl. Phys., vol. 83, No. 1, http://jap.aip.org/jap/copyright.jsp.

Ron Pelrine et al., "High-Speed Electrically Actuated Elastomers with Strain Greater Than 100%", Feb. 4, 2000, pp. 836-839, American Association for the Advancement of Science, vol. 287, www.sciencemag.org.

(Continued)

*Primary Examiner*—Mark Budd
(74) *Attorney, Agent, or Firm*—Haverstock & Owens LLP

(57) ABSTRACT

Electroactive P(VDF-CTFE) copolymers comprising CTFE in ranges between 5 mol % to 20 mol % are disclosed. The electroactive P(VDF-CTFE) copolymers are formed into films that exhibit strain values of 2% or more in response to one or more electromagnetic fields. The electroactive P(VDF-CTFE) copolymer films are deposited using ink-jet printing, slide coating, spin-coating, extrusion coating, meniscus coating, dip coating, spray coating or a combination thereof. Patterned P(VDF-CTFE) copolymer films are formed using lithographic techniques, nanoimprint techniques, nanolithography techniques or a combination thereof. The electroactive P(VDF-CTFE) copolymer films are used in the activation and/or operation of micro-mechanical devices and/or electrical devices.

14 Claims, 9 Drawing Sheets

OTHER PUBLICATIONS

Siegfried Bauer, "Piezo-,pyro-and Ferroelectrets:Soft Transducer Materials for Electromechanical Energy Conversion", Oct. 2006, pp. 953-962, IEE Transactions on Dielectrics and Electrical Insulation, vol. 13, No. 5.

Y. Takase et al., "High-Temperature Characteristics of Nylon-7 Piezoelectrics", 1991, pp. 6644-6652, American Chemical Society, Macromolecules 1991, vol. 24, No. 25.

Qiong Gao et al., "Dipolar Intermolecular Interaction, Structural Development, and Electromechanical I Properties in Ferroelectric Polymer Blends of Nylon-11 Poly(vinylidene fluoride)", Sep.14, 2000, pp. 7564-7572, Macromolecules 2000, vol. 33, No. 20.

Andrew J. Lovinger et al., "Crystalline Forms in a Copolymer of Vinylidene Flouride and Trifluoroethylene (52/48 mol %)", 1982, pp. 323-328, Macromolecules 1982, vol. 15, No. 2.

Q.M. Zhang et al., "Characteristics of the electromechanical response and polarization of electric filed biased ferroelectrics", Mar. 15, 1995, pp. 2549-2555, J. Appl. Phys. vol. 77, No. 6,http://jap.aip.org/jap/copyright.jsp.

Cheng Huang et al., "Polyzinylidene flouride-trifouroethylene/Based High Performance Electroactive Polymers", Apr. 2004, pp. 299-311, IEE Transactions on Dielectrics and Electrical Insulation vol. 11, No. 2.

Q.M. Zhang et al., "Giant Electrostriction and Relaxor Ferroelectric Behavior in Electron-Irradiated Poly(vinylidene flouride-trifluoroethylene) Copolymer", Jun. 26, 1998, pp. 2101-2104, American Association for the Advancement of Science,www.sciencemago.org, Science, vol. 280.

Z.-Y. Cheng et al., "Transverse strain responses in the electrostrictive poly Ñvinylidene fluoride trifluorethylene Öcoploymer", Mar. 29, 1999, pp. 1901-1903, Applied Physics Letters, vol. 74, No. 13.

Shishang Guo et al., "High electrostriction and relaxor ferroelectric behavior in proton -irradiated poly Ñvinylidene fluoride-trifluoethylene Ö copolymer", Apr. 26, 2004, pp. 3349-3351, Applied Physics Letters, vol. 84, No. 17, http://apl.aip.org/apl/copyright.jsp.

Feng Xia et al., "High Electromechanical Responses in a Poly ( vinylidene fluoride-trifluoroethylene-chlorofluoroethylene) Terpolymer", Nov. 4, 2002, pp. 1574-1577, Advanced Materials 2002, 14, No. 21.

Haisheng Xu et al., "Ferroelectric and electromechanical properties of poly Ñvinylidene-fluoride trifluoroethylene chlorotrifluoroethylene terpolymer", Apr. 16, 2001, pp. 2360-2362, Applied Physics Letters, vol. 78, No. 16, http://ojps.aip.org/aplo/aplcr.jsp.

J.T. Garett et al., "Electrostrictive behavior of poly Ñvinnylidene fluoride-trifluooethylene-chlorotrifluoroehtylene Ö", Aug. 11, 2003, pp. 1190-1192, Applied Physics Letters, vol. 83, No. 6, http:// apl.aip.org/apl/copyright.jsp.

Z.-Y. Cheng et al., "Temperature dependence of the dielectric constant of relaxor ferroelectrics", Apr. 1, 1998-II, pp. 8166-8177, Physical Review B, vol. 57, No.14.

Z.-Y. Cheng et al., "Dielectric relaxation behavior and its relation to microstructure in relaxor ferroectric polymers: High-energy electron irradiated poly Nvinylidene fluoride trifluoroethylene O copolymers", Dec. 1, 2002, pp. 6749-6755, Journal of Applied Physics, vol. 92, No. 11, http://ojps.aip.org/japo/japcr.jsp.

Z.-Y. Cheng et al., "Structural Changes and Transitional Behavior Studied from Both Micro-and Macroscale in the High-Energy Electron—Irradiated Poly(vinylidene fluoride-trifluoroethylene)Copolymer", 2002, pp. 664-672, Macromolecules 2002, vol. 35, No. 3.

Zhi-Min Li et al., "Recrystallization Study of High-Energy Electron-Irradiated P(VDF-TrFE) 65/35 Copolymer", Dec. 13, 2003, pp. 79-85, Macromolecules 2004, vol. 37, No. 1.

Zhi-Min Li et al., "Crystalline structure and transition behavior of recrystallized-irradiated P(VDF-TrFE) 65/35 copolymer", Dec. 9, 2004, pp. 014102-1-014102-9, Journal of Applied Physics 97.

Ambalangodage C. Jayasuriya et al., "Crystal-Structure Dependence of Electroactive Properties in Differently Prepared Poly(vinylidene fluoride/hexafluoropropylene) Copolymer Films", 2001, pp. 2793-2799, Journal of Polymer Science Part: B Polymer Physics, vol. 39.

* cited by examiner

US 7,608,976 B1

ELECTROACTIVE CO-POLYMER SYSTEMS AND DEVICES USING THE SAME

RELATED APPLICATIONS

This application claims the priority under 35 U.S.C. § 119(e) of the U.S. Provisional Application Ser. No. 60/900,068, titled "PURE P(VDF-CTFE) COPOLYMERS AS ELECTROACTIVE MATERIALS", filed Feb. 7, 2007, which is hereby incorporated by reference.

FIELD OF THE INVENTION

This invention relates to electroactive copolymers. More specifically, this invention relates to electroactive copolymer systems and devices that use them.

BACKGROUND OF THE INVENTION

In insulation polymers, there exist rich dielectric phenomena ranging from the shape change and reorientation associated with polar polymer chains and bonds, to mesoscopically charged giant dipoles, and pure electrostatic interaction at the meso- and macroscopic levels. Many of these phenomena can be used to develop high performance field activated electroactive polymers (FEAPs) exhibiting very large strain and elastic energy density, characteristics that are very attractive for sensors and actuators.

FEAPs are a class of insulating materials in which response to an electric field is a mechanical strain which can originate from the dipolar response under, and the Columbic interaction with, external electric signals. There are many polarization mechanisms in insulating polymers, from the molecular to the mesoscopic, and even the macroscopic level. These mechanisms couple strongly using mechanical deformation and can be used to create electromechanical polymers, which can be used to develop high performance actuators and sensors. FEAPs feature fast response speed, limited by the polymer dielectric and elastic relaxation times, very large strain level (to more than 100% strain), high electromechanical efficiencies, the ability to operate at the micro/nano-electromechanical levels and a highly reproducible strain response under electric fields. A piezopolymer with 50% energy conversion efficiency will bring breakthroughs in energy harvesting technology, as well as to sensor and actuator technologies.

Applications for FEAPs include pressure/stress sensors in microphones and automobile/highway condition monitoring, loudspeakers in audiosystems, sonar transducers for underwater navigation, ultrasonic transducers for medical diagnosis/imaging, actuators for moving parts, and nondestructive evaluation and monitoring of various civil, mechanical, and aerospace systems. FEAPs exhibit many characteristics favorable to electromechanical actuators and sensors, such as high flexibility, light weight, high stress impact resistance, and easy manufacturing. In the past fifteen years, several discoveries and developments have led to great improvements in the electromechanical performance of field activated electroactive polymers.

SUMMARY OF THE INVENTION

The present invention is directed to a P(VDF-CTFE) copolymer. In some embodiments, the CTFE content of the copolymer is provided in a range of 5 mol % to 20 mol %; in some embodiments, in a range of 8 mol % to 16 mol %; and in some embodiments in a range of 9 mol % to 12 mol. In some embodiments, the P(VDF-CTFE) copolymer is an electroactive copolymer or FEAP that is used to form P(VDF-CTFE) copolymer films that exhibit strain values of 2% or more in response to one or more electric and/or electromagnetic fields. In a particular embodiment of the invention, P(VDF-CTFE) copolymer films are configured to respond to electric fields generated by electrodes that surround or sandwich portions of the P(VDF-CTFE) copolymer films. The electrodes can be charged or energized by a battery or any other suitable power source.

In accordance with the embodiments of the invention, a device includes a P(VDF-CTFE) copolymer film, such as described above, and an electromagnetic field generator configured to generate the electromagnetic field. Preferably, the P(VDF-CTFE) copolymer film is in mechanical communication or contact with one or more actuators and/or switches. In operation, an electromagnetic field is applied across the P(VDF-CTFE) copolymer film and the P(VDF-CTFE) copolymer film deforms, thereby actuating the one or more actuators and/or switches. Alternatively, the one or more actuators and/or switches are actuated by removing the electromagnetic field.

In accordance with the method of the invention, a device is made using a P(VDF-CTFE) copolymer film, such as described above, and coupling the P(VDF-CTFE) copolymer film to an electromagnetic field generator. The P(VDF-CTFE) copolymer film is preferably formed from a solution of P(VDF-CTFE) in N,N dimethylformamide that is deposited on a suitable substrate. The film is then stretched, cured or a combination thereof. In accordance with the embodiments of the invention, the solution of P(VDF-CTFE) in N,N dimethylformamide is deposited using ink-jet printing, slide coating, spin-coating, extrusion coating, meniscus coating, dip coating, spray coating or a combination thereof.

In still further embodiments of the invention, a P(VDF-CTFE) copolymer film is a patterned P(VDF-CTFE) copolymer film. The patterned P(VDF-CTFE) copolymer is formed from a continuous P(VDF-CTFE) copolymer film that is deposited, cured and/or stretched and then patterned using, for example, lithographic techniques. Alternatively, the patterned P(VDF-CTFE) copolymer film is formed by direct deposition of a patterned P(VDF-CTFE) copolymer film using, for example, nanoimprint techniques and/or nanolithography techniques.

DETAILED DESCRIPTION

Theory

One attractive feature of FEAPs is that their electromechanical response may originate from a change in chemical bonds and/or molecular configurations, making it possible to develop high performance electroactive micro/nano-scale devices and molecular devices. During the past several years, novel processing techniques have been developed for fabricating micro/nano-scale EAP devices.

I. Electromechanical Effects in FEAPs:

In general, FEAPs can be divided into four major groups based on the structure and morphology of the polymers: piezoelectric, electrostrictive, electrostatic force (Maxwell stress) and electret based FEAPs.

The piezoelectric effect defined by Eq. (1) and the electrostriction defined by Eq. (2) describe the coupling between the mechanical strain (x)/stress (X) and the electric field (E)/displacement (D) or polarization (P), where d, Q and M the are piezoelectric constant and the charge and field related electrostrictive coefficients, respectively, and $\in_0$ and $\kappa$ are the vacuum dielectric permittivity and the dielectric constant.

BOX I. Equations $$x = dE \text{ or } D = dX \quad (1)$$

$$x = Qp^2 = Q\epsilon_0^2(\kappa-1)^2 E^2 = ME^2 \quad (2)$$

The piezoelectric effect is found in crystals with certain symmetries.

Electrostriction, which originates from the change in the dipole density in the material, occurs in all substances, crystalline or amorphous, solid or liquid.

II. Piezoelectric Polymers:

Among all piezoelectric polymers, the PVDF homopolymer and the P(VDF-TrFE) copolymer are the best known and exhibit the highest electromechanical response at room temperature (RT).

For PVDF, there are at least four crystalline phases, of which the β-phase and the α-phase are the most relevant for applications. In the β-phase, these polymers are ferroelectric, exhibiting large piezoelectricity after proper poling, and are the most widely used piezoelectric polymers. Piezoelectric polymers, such as PVDF homopolymer and P(VDF-TrFE) copolymer, have been used in many commercial sensors and actuators. However, these polymers exhibit a much weaker piezoelectric response than piezoelectric ceramics and crystals. Additionally, for actuation applications, the strain response in these piezoelectric polymers and ceramics is very small (<0.2%).

Figure 3:
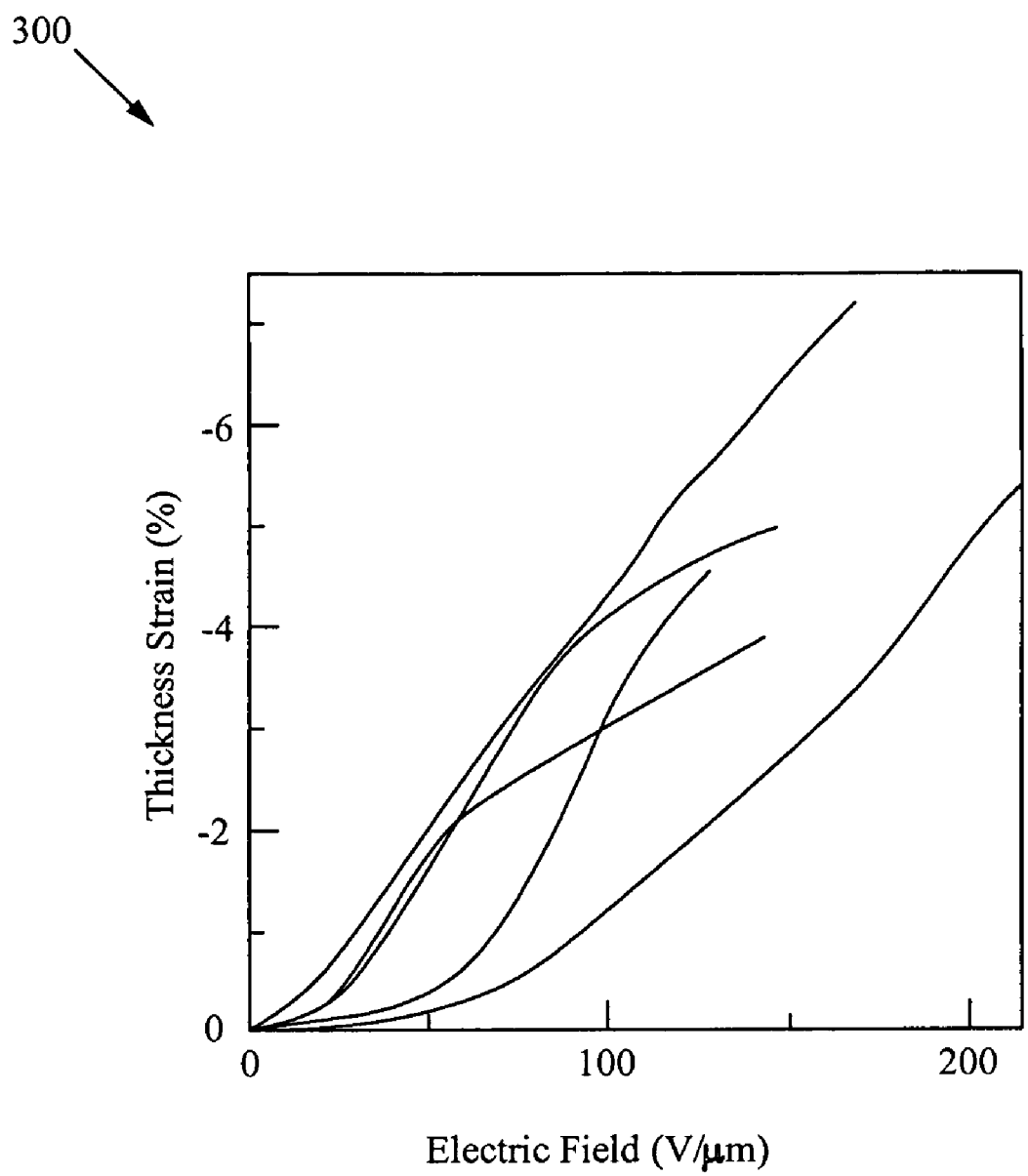
FIG. 3 illustrates thickness strain response versus electric field curves for ESPs: irradiated P(VDF-TrFE) copolymer, P(VDF-TrFE-CTFE), P(VDF-CTFE), and P(VDF-TrFE-CFE).

III. Newly Developed Electrostrictive Polymers:

To improve the electromechanical response of the polymers, different approaches have been investigated in the last 15 years. The newly developed electrostrictive polymers can exhibit a strain as high as 5% as shown in FIG. 3. These new electrostrictive polymers were created using the following approaches: (1) irradiating P(VDF-TrFE) copolymer using high-energy electrons or protons; and (2) modifying P(VDF-TrFE) using a third monomer to form terpolymers.

BOX II. Some monomers used in PVDF-based ESPs and their formula

| | |
|---|---|
| Vinylidene fluoride (VDF) | $CH_2=CHF_2$ |
| Trifluoroethylene (TrFE) | $CHF=CHF_2$ |
| Chlorofluoroethylene (CFE) | $CH_2=CFCl$ |
| Chlorotrifluoroethylene (CTFE) | $CF_2=CFCl$ |
| Hexafluoropropylene (HFP) | $CF_2=CF-CF_3$ |

Figure 1:
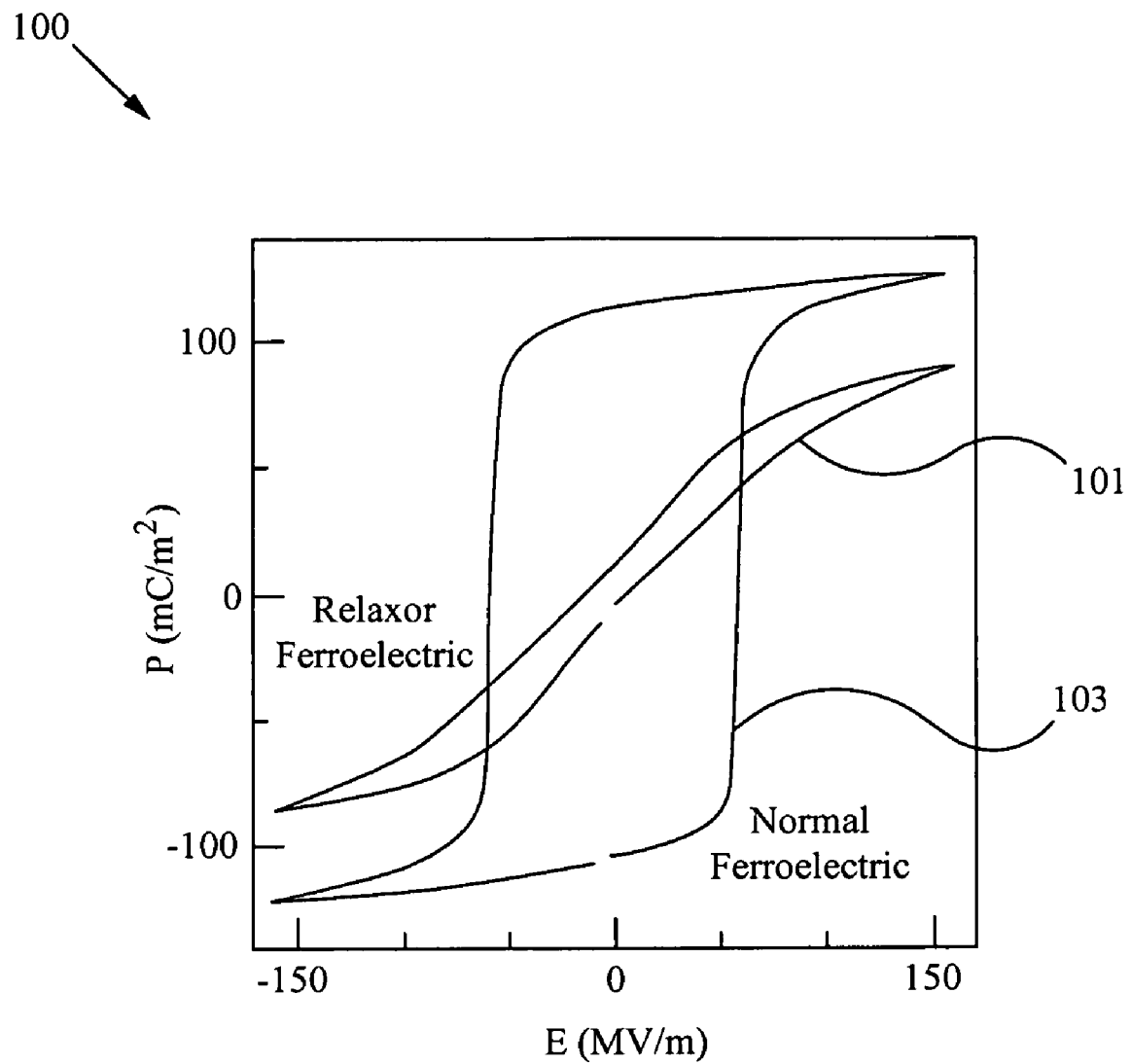
FIG. 1 shows polarization versus electric field (P-E) loop for a normal-ferroelectric polymer and a slim P-E loop for a relaxor ferroelectric (irradiated P(VDF-TrFE) 68/32 mol %).
Figure 2A:
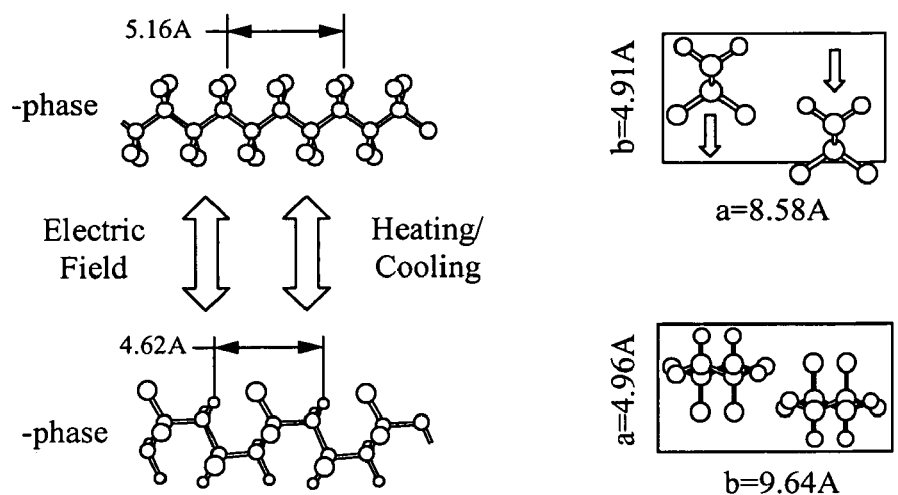
FIGS. 2A-C illustrate several response curves to electric fields in an insulation polymer that may result in large mechanical deformation (electromechanical coupling): (A) change in dipole density associated with the change in polymer chain shape (molecular conformation change in PVDF is used here as an example); (2B) electrostatic force on soft polymers with high electric breakdown strengths, where the deformation is directly related to the softness of the spring/polymers and the amount of charge on the surface/electrodes; and (2C) reorientation of dipoles in a polymer, leading to electrostriction and piezoelectric responses, in accordance with the embodiments of the invention.
Figure 2B:
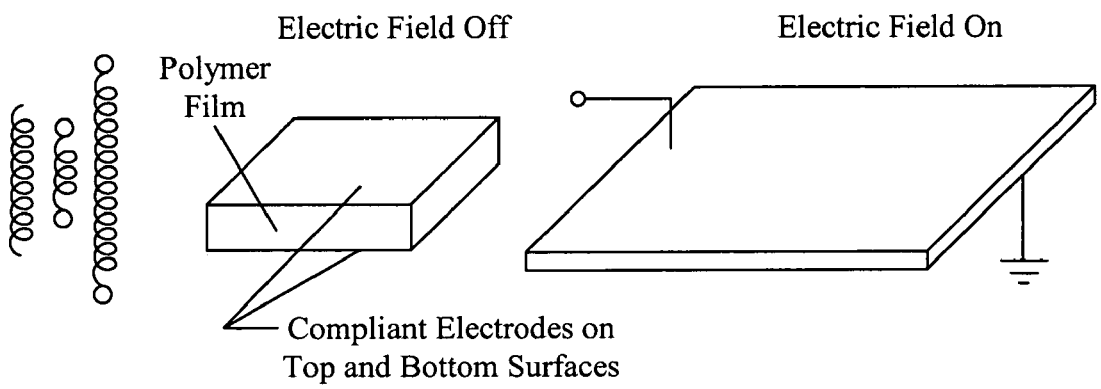
Figure 2C:
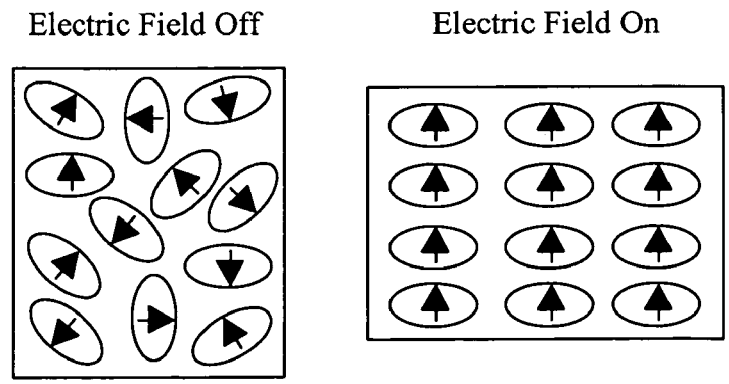

IV. Maxwell Stress Effect Based FEAPs:

A great advance in using the MWS effect for FEAPs is the discovery that some soft polymers such as dielectric elastomers (Y~1 MPa) can exhibit a giant field-induced strain, a transverse strain more than 100% as schematically illustrated in FIG. 2B. The giant strain in these polymers (elastomers) is observed when a large pre-stress is applied on the polymers.

V. Comparison of EAPs for Applications:

Besides strain response, elastic energy density ($W_E$) and electromechanical coupling factor (k), as well as blocking force, are important parameters for electromechanical applications. The new FEAPs have a much higher $W_E$. These FEAPs also exhibit a $\kappa_{33}$ comparable to and a $\kappa_{31}$ (>0.6 for irradiated copolymer and ~0.8 for elastomers) much higher than those for piezoceramics ($\kappa_{33}$~0.7 and $\kappa_{31}$~0.4). Due to their high elastic modulus (Y=100~1200 MPa), the EAPs exhibit a high blocking force (20~50 MPa).

DETAILED DESCRIPTION OF A PREFERRED EMBODIMENT

The present invention is directed to electroactive polymers (EAPs) or FEAPs and systems and devices that utilize them. Electroactive polymers are polymers whose shapes change as an electric field is applied, such as described in detail above. Electroactive polymers have a great potential for applications in current and future technologies, such as actuators, electromechanical (E-M) and acoustic transducers, and artificial organs.

In accordance with the embodiments of the invention, an electroactive polymer includes a P(VDF-CTFE) copolymer in the form of a film. The film is deposited or formed using any suitable coating technique including, but not limited to, ink-jet printing, slide coating, spin-coating, extrusion coating, meniscus coating, dip coating and spray coating. The films formed in accordance with the embodiments of the invention are then patterned using any suitable patterning technique including, but not limited to, chemical and photo-lithographic techniques. Alternatively, patterned electroactive polymer films are formed using direct pattern transfer techniques and nanoimprint lithography techniques, mentioned previously.

In accordance with an embodiment of the invention, electroactive polymer P(VDF-CTFE) copolymers comprise CTFE in a range of 5 mol % to 20 mol %. In some embodiments, the electroactive polymer P(VDF-CTFE) copolymers comprise CTFE in a range of 8 mol % to 16 mol %. In some embodiments, electroactive polymer P(VDF-CTFE) copolymers comprise CTFE in a range of 9 mol % to 12 mol %. Data presented herein are directed to electroactive polymer P(VDF-CTFE) copolymers with 9 mol % CTFE, also referred to herein as CT9, and 12 mol % CTFE, also referred to herein as CT12. The electromechanical responses of poly(vinylidene-fluoride-chlorotrifluoroethylene) [P(VDF-CTFE)] copolymers with 9 mol % (CT9) and 12 mol % CTFE (CT12) have shown to be particularly promising.

CT12 at room temperature exhibits an electrostrictive strain response of more than 5% and a piezoelectric constant $d_{33}$ of 140 pC/N at a dc bias of 70 Mv/m. It is found that about 70% of crystalline regions in both copolymers is at the nonpolar phase and that CT9 has a crystallinity about 25% higher than that of CT12. The difference in electromechanical performance between CT9 and CT12 cannot be completely explained using the structure/conformation change alone. It is believed that the contribution of the interfacial layers to the polarization and electrostrictive strain response plays an important role in electrical performance.

The copolymer films were prepared using solution casting by dissolving P(VDF-CTFE) in N,N dimethylformamide. The solution was cast on a glass substrate and dried at 70° C. for 8 hr in an oven. The cast film was then mechanically uniaxially stretched to three to four times its original length at room temperature (RT). The stretched films were annealed at 120° C. for 2 hr and then 140° C. for 10 hr. The thickness of the films used was in a range of 25 to 35 mm.

To characterize the polarization and E-M properties, the film was sputtered with gold electrodes (~40 nm in thickness) on both surfaces. The polarization hysteresis loop was determined using a ferroelectric test system. An electric field with a triangular waveform at a frequency of 10 Hz was employed in the measurements. The electrostrictive strain along the thickness direction of the film was measured using a cantilever to transfer the thickness change into the deflection of the cantilever. The deflection of the cantilever was measured using a Photonic sensor and the signal of the Photonic sensor was measured using a lock-in amplifier. For the electrostrictive strain measurement, the external electric field at 1 Hz was applied, while the strain at 2 Hz was measured. To characterize the apparent piezoelectricity, the external electric field at 1 Hz was applied, while the strain at 1 Hz was measured. The x-ray diffraction (XRD) and differential scanning calorimetry (DSC) were employed to determine the structure and phase transition.

Figure 4A:
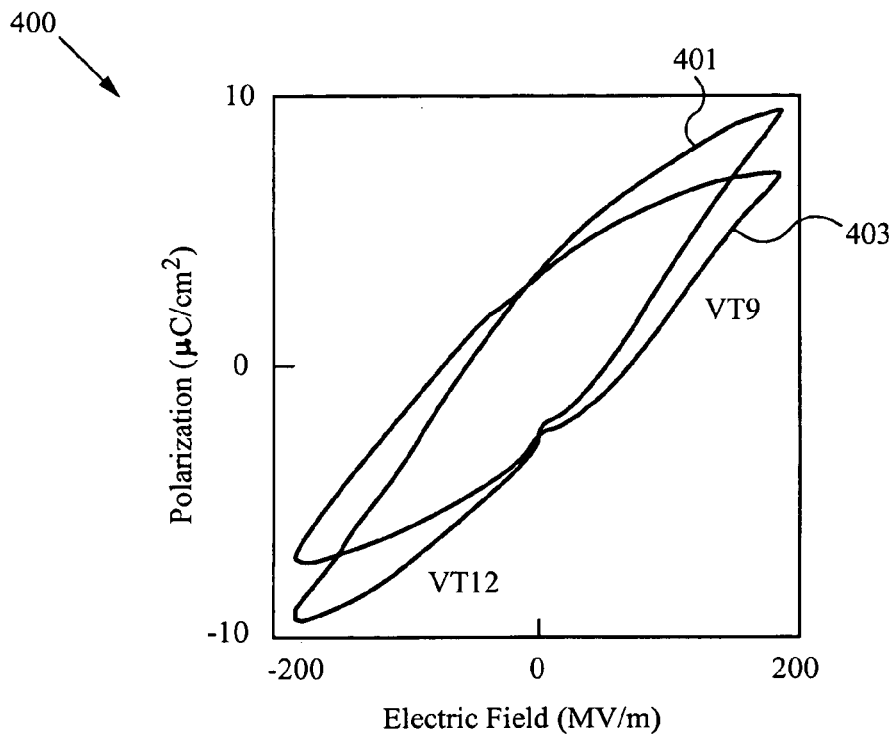
FIGS. 4A-B show polarization hysteresis loops of CT9 and CT 12 samples at room temperature (4A); and the maximum polarization $P_s$ and remanent polarization $P_r$ versus maximum electric field applied (4B).
Figure 4B:
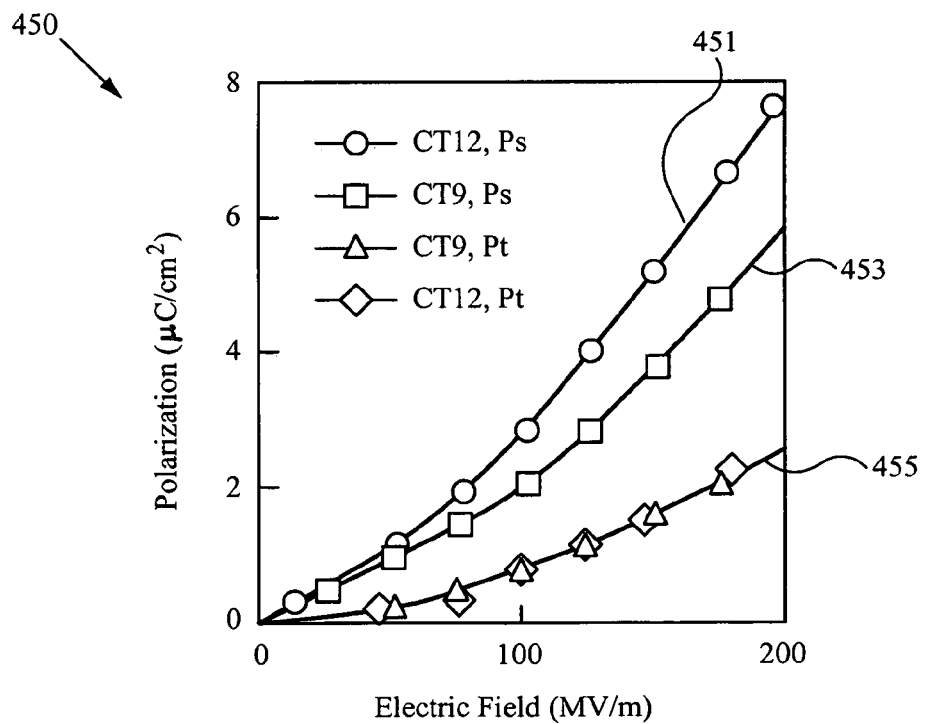

FIG. 4A shows a plot 400 of hysteresis loops 403 and 401 for copolymers CT9 and CT12 at RT, respetcively. The remanent polarization measured under different electric fields in CT9 and CT12 is almost the same. However, CT12 has a higher polarization response than that of the response for CT9. The results indicate that the introduction of bulky CTFE into PVDF modifies the structure and properties, especially the ferroelectricity. The higher polarization level observed in CT12 indicates that the introduction of bulky CTFE makes the structure loose, which in turn makes the orientation of dipoles under an external electric field much easier to align. Similar to the maximum polarization PS responses 453 and 451 and remanent polarization Pr responses 455 versus maximum electric field applied, plotted in the graph 450 shown in FIG. 4B for CT9 and CT 12, the electrostrictive strain response of CT12 is higher than that of CT9.

Figure 5A:
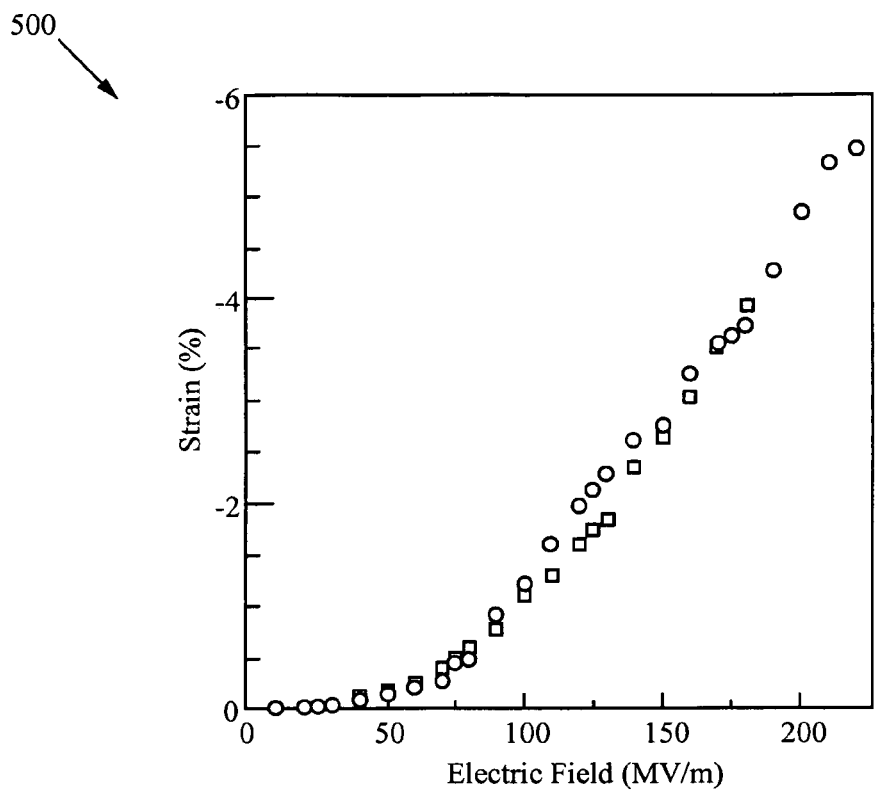
FIGS. 5A-B show electro-active strains along the thickness direction versus electric field (E) for two CT12 samples at room temperature (5A); and the strain response versus $E^2$, wherein the solid line is plotted using a linear fit over electric fields ranging from 0 to 200 MV/m (5B).
Figure 5B:
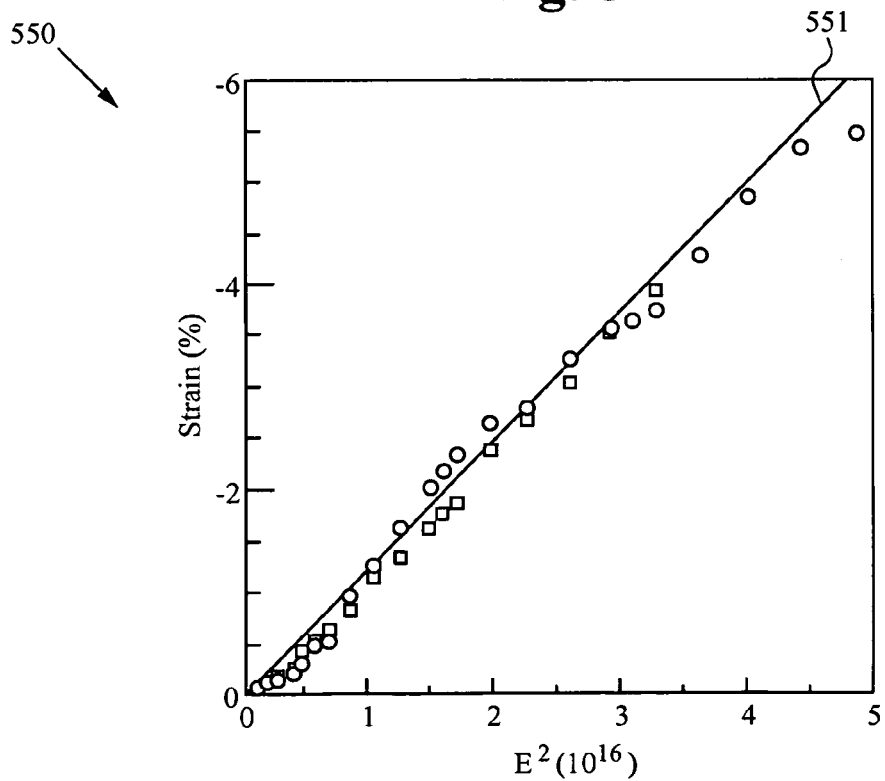

FIGS. 5A-B show graphs 500 and 550 of electro-active strain along the thickness direction versus electric field (E) for two CT12 samples at room temperature and the strain response versus $E^2$, respectively, wherein the solid line 551 is plotted using a linear fit over electric fields ranging from 0 to 200 NV/m, respectively. It can be seen from the graphs 500 and 550 that at RT the maximum strain obtained in CT9 is less than 3%, while the maximum strain obtained in CT12 is more than 5%, which is higher than that previously observed for P(VDF-TrFE-CTFE) and the irradiated P(VDF-TrFE) polymers. The relationship between the strain (S) and the square of the electric field (E) as plotted on the line 551 shown in FIG. 5B, reveals the electrostrictive nature for the E-M properties. For the electrostrictive effect, it is known that $S=ME^2$, where M is the electric field related electrostrictive coefficient. The data shown in FIG. 5B result in an M of $1.23\pm0.02\times 10^{-18}(m^2/V^2)$.

Figure 6:
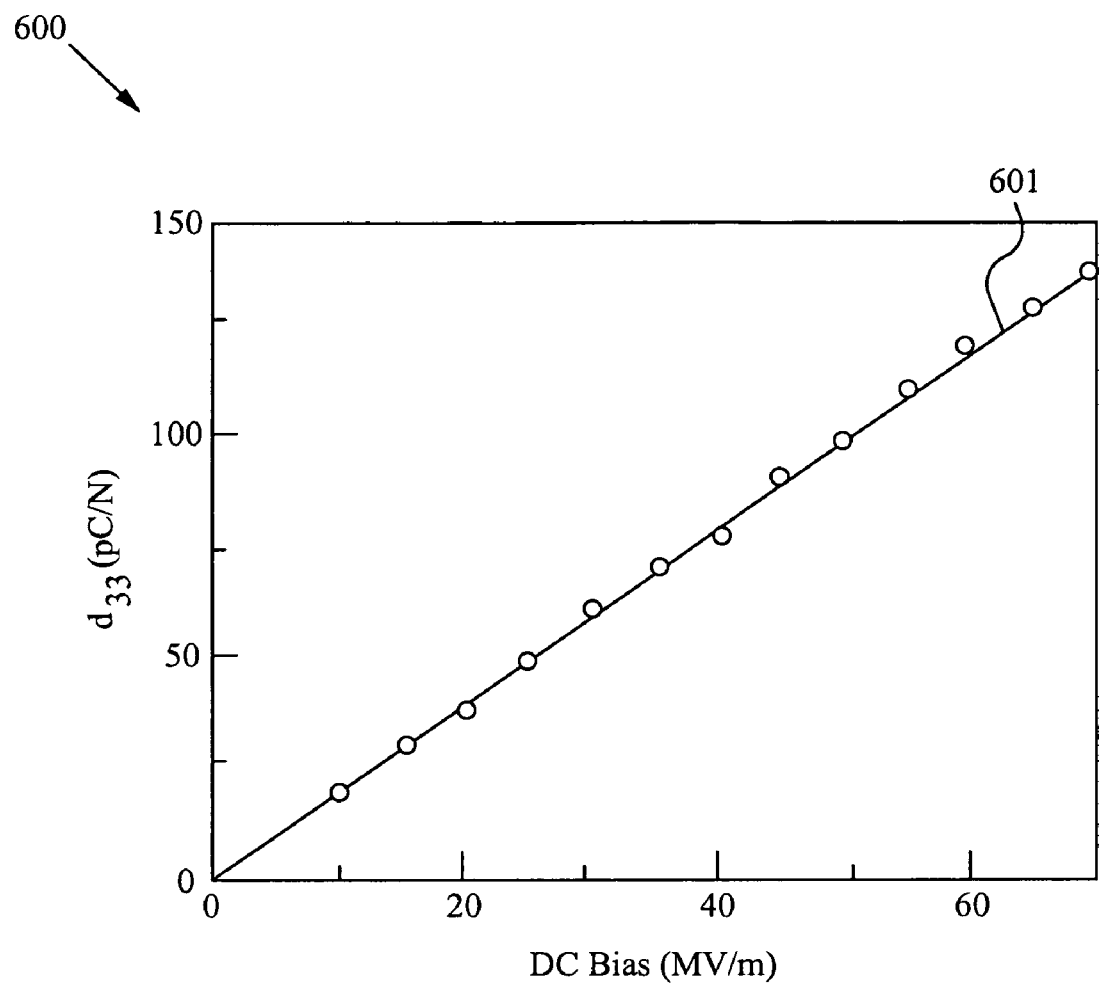
FIG. 6 shows a graph of the apparent piezoelectric constant $d_{33}$ versus dc bias for samples of CT12 at room temperature and with a linear fitted line.

The E-M performance of the CT12 under different dc biases was characterized by imposing an AC field (fixed as 10 MV/m) on the DC field. FIG. 6 shows a graph 600 of the apparent piezoelectric constant $d_{33}$ versus DC bias for samples of CT12 at room temperature and with a liner fitted line. Based on the strain response and the ac field, the piezoelectric constant $d_{33}$ is obtained as shown by the line 601 plotted in FIG. 6. As expected for electrostrictive effect, the piezoelectric constant is linearly dependent on the DC bias. A piezoelectric constant $d_{33}$ as high as 140 pC/N is observed.

Figure 7:
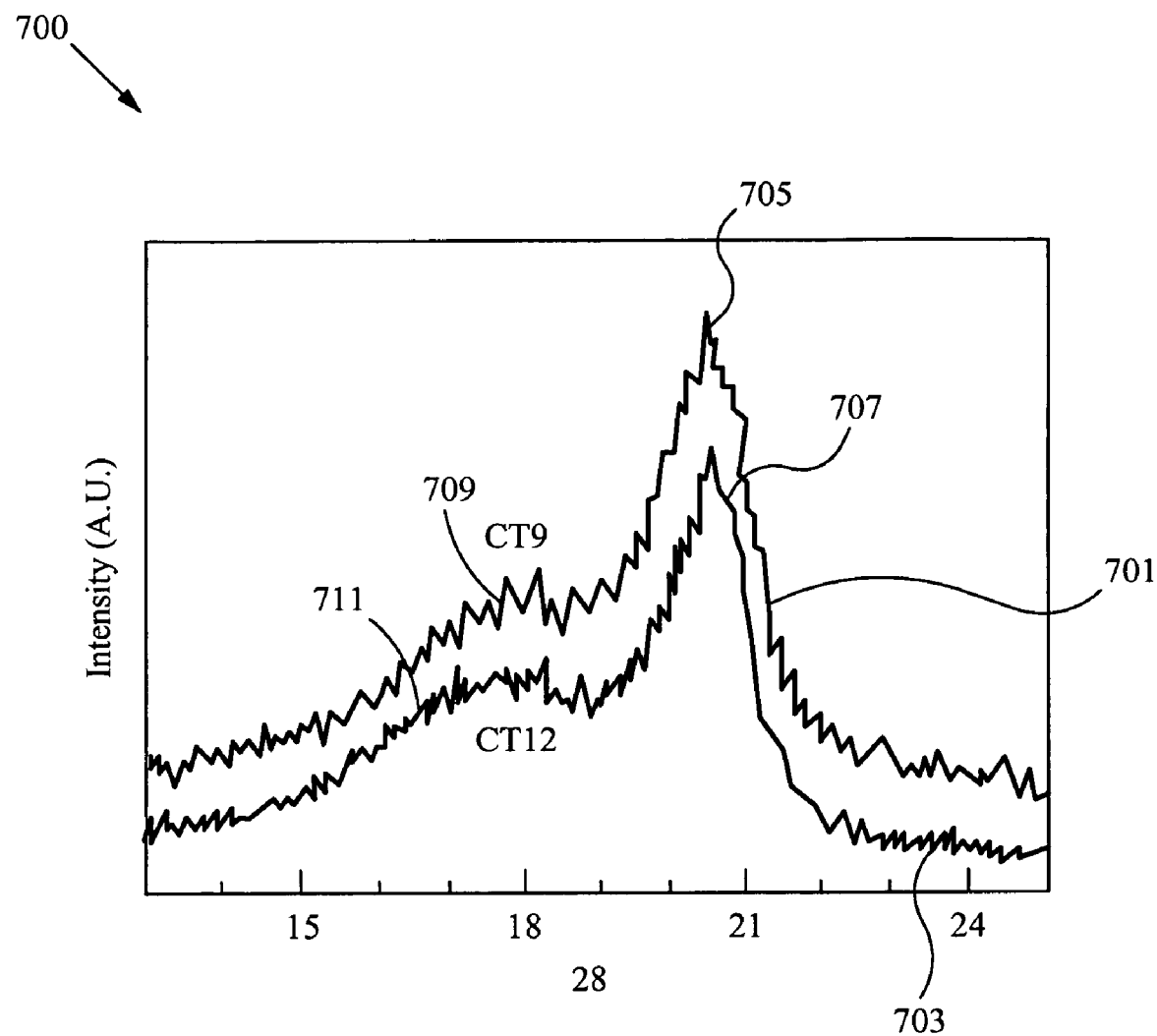
FIG. 7 shows a graph of XRD data for samples of CT9 and CT12 at room temperature.

At this point, it is interesting to examine the nature of the electrostrictive effect and to exploit the mechanism behind the high E-M performance obtained in P(VDF-CTFE). FIG. 7 shows a graph 700 of XRD data for samples of CT9 and CT12 at room temperature. The plots 701 and 703 of the XRD data obtained in CT9 and CT12 at RT shown in the graph 700 reveal that CT9 and CT12 both exhibit a two-peak pattern, one set of peaks 709 and 711 located at a low angle (~18°) and the other set of peaks 705 and 707 at a high angle (>20°). It is known that for PVDF and P(VDF-TrFE), the peaks 705 and 707 at the high angle correspond to the polymer chains with all-trans conformations (ferroelectric phase), while the peaks at the low angle reflect the polymer chains with TG conformations (paraelectric phase), where T and G are trans and gauche conformations. Therefore, we call the structure associated with the high angle the polar phase (PP) and the structure associated with the low angle the nonpolar phase (NP).

Data shown in FIG. 7 were fitted using a two-peak model. The fitting results are shown in Table 1 below, where FWHM is the full width at half maximum. One can find that the peak location is almost the same for PP in both CT9 and CT12, while the peak for NP in CT12 is located at a lower angle than that in CT9. In other words, the PP in both copolymers has the same interchain space ($d_{200,110}$=4.33 Å for CT9 and $d_{200,110}$=4.32 Å for CT12), while the NP in CT12 ($d_{200,110}$=4.87 Å) is looser than that in CT9 ($d_{200,110}$=4.78 Å). Therefore, the difference in the interchain space between PP and NP is 0.55 Å (or 11.3%) for CT12 and 0.45 Å (or 9.4%) for CT9. The investigation on the irradiated P(VDF-TrFE) 68/32 mol % copolymers indicates that at RT the difference in the interchain space between PP and NP is 0.37 Å (or 7.6%), which is smaller than what was obtained in P(VDF-CTFE) copolymers. Additionally, based on the area of the peaks shown in Table 1, it is estimated that CT12 has a slightly higher weight (72%) of the NP than CT9 (69%).

It is believed that the high E-M response obtained in the irradiated P(VDF-TrFE) originates from the electric-field-induced structure/conformation change. That is, the phase(s)

with TG/T$_3$G conformations is transformed to PP with all-trans conformation under an external electric field. Therefore, one may link the E-M response observed in P(VDF-CTFE) to the electric-field-induced structure/conformation change.

TABLE 1

Fitting results for x-ray 200.110 diffraction peak obtained in CT9 and CT12 at RT using a two-peak model.

| Materials | Peak 2 | Amplitude | FWHM | Area | Percentage |
|---|---|---|---|---|---|
| CT12 | 18.18 | 292 | 5.12 | 1495 | 72% |
|  | 20.55 | 510 | 1.14 | 581 | 38% |
| CT9 | 18.54 | 288 | 4.79 | 1379 | 69% |
|  | 20.50 | 509 | 1.21 | 616 | 31% |

Although the NP has a higher weight, the PP has a higher amplitude as shown in FIG. 7 and Table 1. By employing the Scherrer equation, Equation (1)

$$D_{hkl} = \frac{0.9\lambda}{B\cos(\theta)}$$

the size of the coherence x-ray reflect region ($D_{hkl}$) can be estimated. In the Equation 1, $\lambda$ is the x-ray wavelength, B is the FWHM, $\theta$ is the peak angular position. At RT, $D_{110/200}$=1.6 nm and 1.7 nm for the NP in CT12 and CT9, respectively, while $D_{110,200}$=7.1 nm and 6.7 nm for the PP in CT12 and CT9, respectively. The fact that the crystals at the PP have a larger size than that at the NP indicates that the PP may be the stable phase for bulky crystal in the copolymers at RT, while the stable structure of crystals at small sizes (<2 nm) is NP. This is similar to the results obtained in the irradiated P(VDF-TrFE) copolymer.

Figure 8:
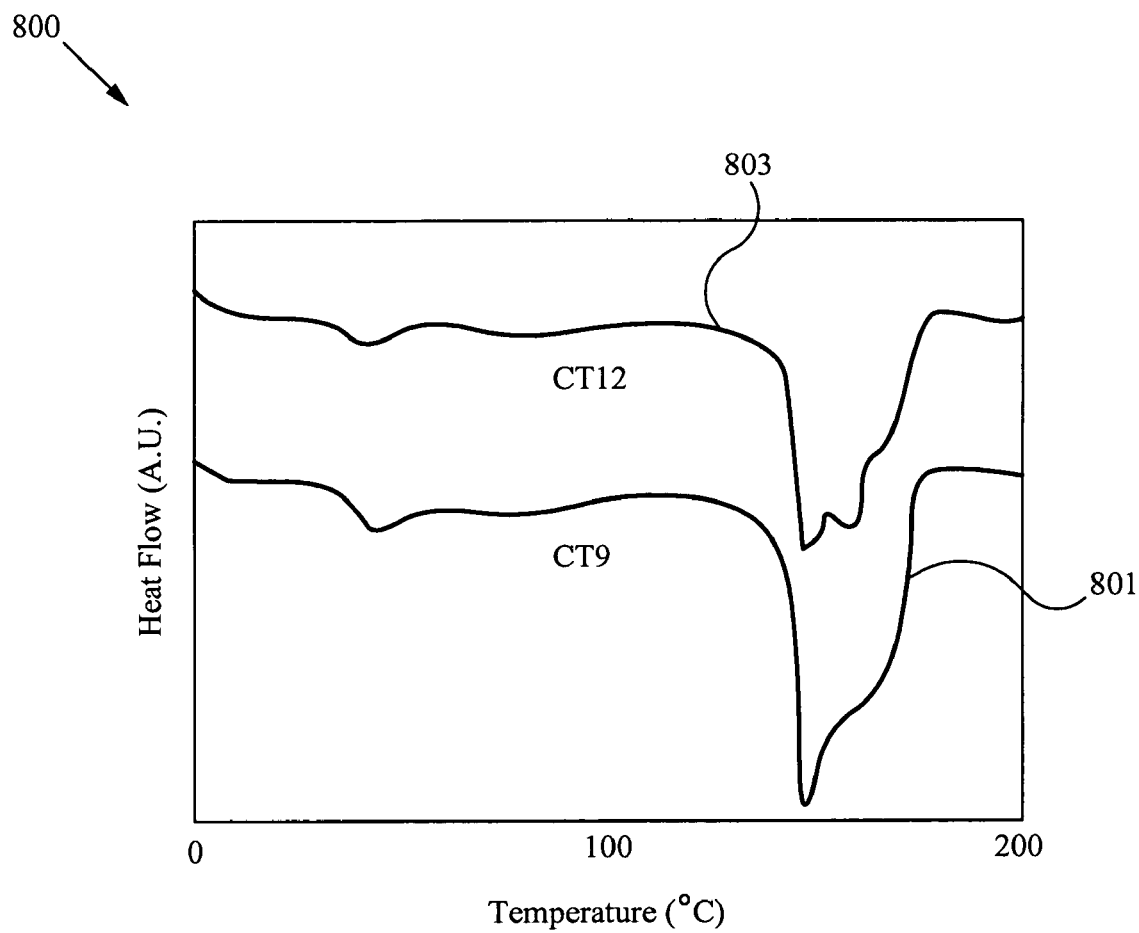
FIG. 8 shows a graph of DSC data collected by heating samples of CT9 and CT12 at 60° C. to 225° C. with temperatures increasing at a rate of 110° C. per/min.

FIG. 8 shows a graph 800 of the DSC data plotted 801 and 803 for CT9 and CT12, respectively. From this data it is found that the melt enthalpy ($\Delta H_m$) is about 25 J/g and 19 J/g for CT9 and CT12, respectively, and that the enthalpy ($\Delta H_p$) associated with the PP to NP transition at ~42° C. is 1.18 J/g for CT9 and 0.89 J/g for CT12. That is, the ratio of DHp to DHm is 4.72% for CT9 and 4.68% for CT12, respectively. This indicates that the percentage of crystalline regions with the PP is almost the same for both copolymers. This is consistent with the XRD data as shown in Table I. However, assuming that the $\Delta H_m$ in both CT9 and CT12 is the same, one can conclude that CT9 has a crystallinity about 25% higher than that for CT12. Therefore, CT9 has more crystalline regions available for switching from NP to PP under an external electrical field than does CT12. This contradicts with the results shown in FIGS. 4A-B and 5A-B, if the high polarization and E-M responses only originates from the structure/conformation change in crystalline regions.

In a systematic study of P(VDF-TrFE-CTFE), it is found that the high E-M performance cannot be well understood by accounting for the electric-field-induced phase transition and the Maxwell effect. It is concluded that there is an unknown mechanism responsible for the high E-M performance. The effects of the recrystallization effect on the irradiated P(VDF-TrFE) have also been examined and it has been found that besides the phase/conformation change and the Maxwell effect there is another mechanism—ordering degree change in partially ordered regions such as the interfacial layer between crystalline and amorphous regions—that is responsible for the high polarization and E-M responses. Considering the nano-sized crystals in P(VDF-CTFE), one would conclude there exists a large amount of interfacial layers, which were not reflected in the XRD and DSC data. The interfacial layers contribute significantly to the polarization and E-M responses. This may explain why the E-M response in CT12 is much higher than that in CT9. However, the nature of the interfacial layers in the copolymer is not clear at this stage.

Figure 9:
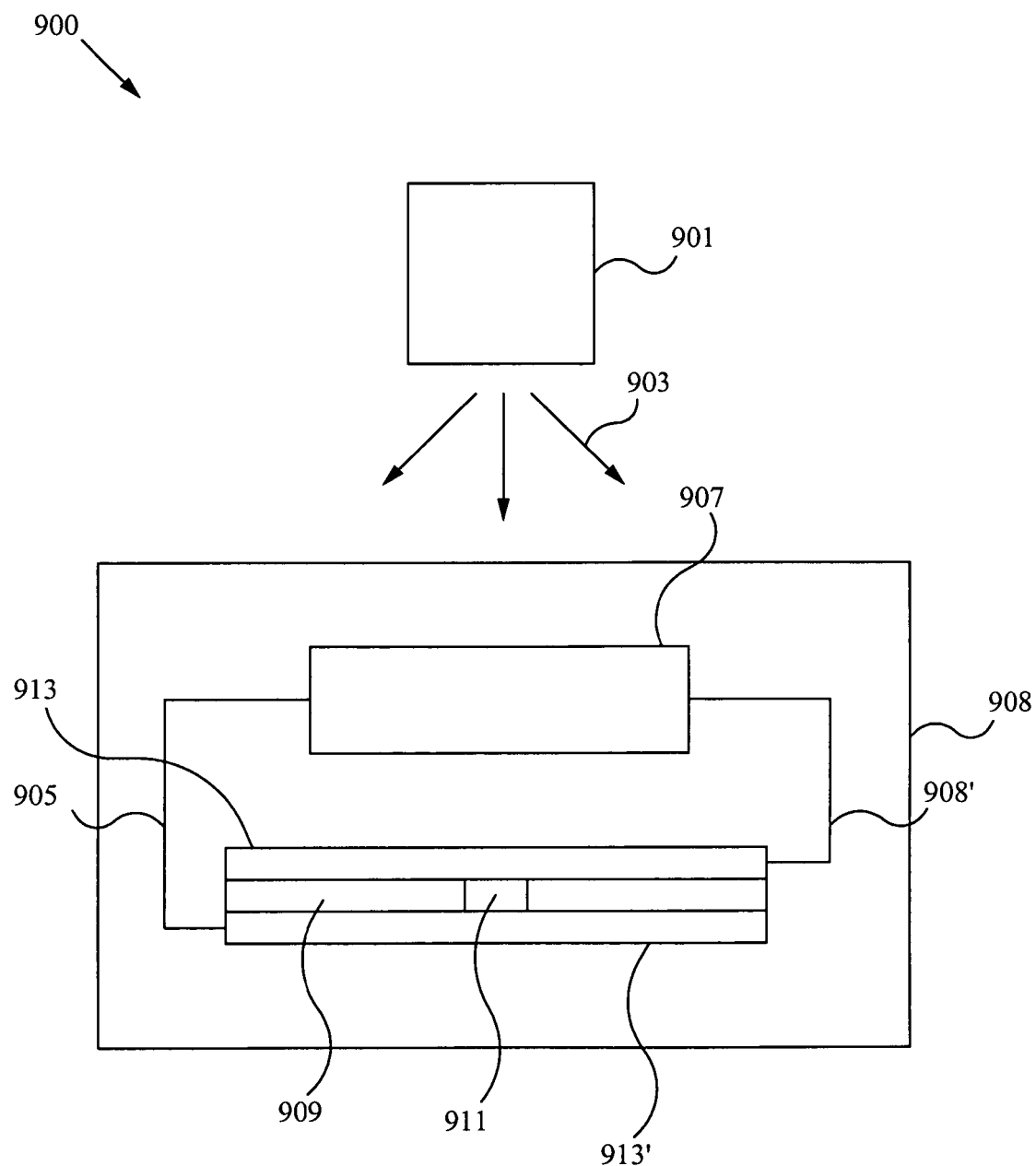
FIG. 9 shows a schematic diagram of a device with a film of a field activated electroactive polymer, in accordance with the embodiments of the invention.

FIG. 9 shows a schematic representation of a device 900 with an electroactive polymer P(VDF-CTFE) copolymer film 909 that in some embodiments comprises CTFE in a range of 5 mol % to 20 mol %; in some embodiments, the CTFE is in a range of 8 mol % to 16 mol %; and in some embodiments, the CTFE is in a range of 9 mol % to 12 mol, such as described in detail above. The device 900 includes a housing 908 and one or more electromagnet field generators 901 and 907. In accordance with the embodiments of the invention, one of the electromagnet field generators 901 is a magnetic or optical electromagnet field generator that generates a remote or external electromagnet field represented by the arrows 903 that causes the electroactive polymer P(VDF-CTFE) copolymer film 909 to physically deform and thereby activate or actuate a switch 911 or any other mechanical or electrical component. Alternatively, or in addition to the electromagnet field generator 901, the device 900 includes an electromagnet field generator 907 that includes a circuit and/or battery. The electromagnet field generator 907 is configured to generate an electromagnet field across an electroactive polymer P(VDF-CTFE) copolymer film 909 through electrodes 913 and 913' that are in electrical communication with the electromagnet field generator 907 through electrical contacts 905 and 905'

In conclusion, a high E-M response was obtained in P(VDF-CTFE) copolymers. For the copolymers with 12 mol % CTFE, an electrostrictive strain response of more than 2% was observed. For the copolymers under a DC bias of 70 NV/m, a piezoelectric constant of 140 pC/N was obtained. Compared to other PVDF-based EAPs or FEAPs, the P(VDF-CTFE) exhibits a higher strain response, but require a higher driving electric field. From an applications point of view, the major advantage of P(VDF-CTFE) over other PVDF-based EAPs or FEAPs is that P(VDF-CTFE) is very inexpensive and commercially available. The difference in the E-M behavior between CT9 and CT12 can not be well explained by using electric field induced structure/conformation change alone. The contribution to the polarization and E-M responses from the interfacial layers is used to explain the experimental results obtained in P(VDF-CTFE) copolymers. This new class of electroactive polymers has a great potential for applications in current and future technologies, such as actuators, electromechanical (E-M) and acoustic transducers, and artificial organs.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications can be made in the embodiments chosen for illustration without departing from the spirit and scope of the invention. Specifically, it will be apparent to one of ordinary skill in the art that the device of the present invention could be implemented in several different ways and the apparatus disclosed above is only illustrative of the preferred embodiment of the invention and is in no way a limitation.

The invention claimed is:

1. A P(VDF-CTFE) copolymer comprising CTFE in a range of 5 mol % to 20 mol % and exhibiting a strain value of 2% or more in response to an electromagnetic field.

2. The P(VDF-CTFE) copolymer of claim 1, wherein the CTFE is in a range of 8 mol % to 16 mol %.

3. The P(VDF-CTFE) copolymer of claim 1, wherein the CTFE is in a range of 9 mol % to 12 mol.

4. The P(VDF-CTFE) copolymer of claim 1, wherein the copolymer is a film.

5. The P(VDF-CTFE) copolymer of claim 4, wherein the film is in mechanical communication with an actuator component.

6. The P(VDF-CTFE) copolymer of claim 4, wherein the film is patterned.

7. A device comprising a P(VDF-CTFE) copolymer film comprising CTFE in a range of 5 mol % to 20 mol % and exhibiting a strain value of 2% or more in response to an electromagnetic field.

8. The device of claim 7, wherein the CTFE is in a range of 8 mol % to 16 mol %.

9. The device of claim 7, wherein the CTFE is in a range of 9 mol % to 12 mol.

10. The device of claim 7, further comprising an electromagnetic field generator configured for generating the electromagnetic field.

11. The device of claim 10, wherein electromagnetic field generator is selected from the group consisting of an optical electromagnetic field generator and a magnetic electromagnetic field generator.

12. The device of claim 10, wherein electromagnetic field generator includes electrodes that sandwich at least a portion of the P(VDF-CTFE) copolymer film.

13. The device of claim 7, further comprising one or more of an actuator and a switch that is in mechanical communication with at least a portion of the P(VDF-CTFE) copolymer film.

14. The device of claim 7, wherein the P(VDF-CTFE) copolymer film is a patterned P(VDF-CTFE) copolymer film.

* * * * *

UNITED STATES PATENT AND TRADEMARK OFFICE
CERTIFICATE OF CORRECTION

PATENT NO.         : 7,608,976 B1                                        Page 1 of 1
APPLICATION NO. : 12/069312
DATED              : October 27, 2009
INVENTOR(S)        : Cheng et al.

It is certified that error appears in the above-identified patent and that said Letters Patent is hereby corrected as shown below:

At column 3, line 50, please replace "$x=Qp^2$" with "$x=QP^2$" and please replace "$Q\epsilon_0^2$" with "$Q\varepsilon_0^2$" so that the equation correctly reads:

-- $x=QP^2=Q\varepsilon_0^2(\kappa-1)^2E^2=ME^2$ --

At column 5, line 19, please replace "70 Mv/m" with "70 MV/m" so that the sentence correctly reads:

-- CT12 at room temperature exhibits an electrostrictive strain response of more than 5% and a piezoelectric constant $d_{33}$ of 140 pC/N at a dc bias of 70 MV/m. --

Signed and Sealed this

Twelfth Day of January, 2010

David J. Kappos
*Director of the United States Patent and Trademark Office*